United States Patent [19]

Futatsuka et al.

[11] Patent Number: 4,877,577
[45] Date of Patent: Oct. 31, 1989

[54] COPPER ALLOY LEAD FRAME MATERIAL FOR SEMICONDUCTOR DEVICES

[75] Inventors: Rensei Futatsuka; Synu-ichi Chiba; Tadao Sakakibara, all of Japan

[73] Assignee: Mitsubishi Shindoh Co., Ltd., Tokyo, Japan

[21] Appl. No.: 256,747

[22] Filed: Oct. 12, 1988

[30] Foreign Application Priority Data

Apr. 25, 1988 [JP]  Japan ................................. 63-101748

[51] Int. Cl.$^4$ ................................................ C22C 9/02
[52] U.S. Cl. ..................................... 420/473; 420/475
[58] Field of Search ........................ 420/473, 474, 475

[56] References Cited

U.S. PATENT DOCUMENTS 4,612,167  9/1986  Watanabe et al. ................... 420/473

*Primary Examiner*—L. Dewayne Rutledge
*Assistant Examiner*—David Schumaker

*Attorney, Agent, or Firm*—Frishauf, Holtz, Goodman & Woodward

[57] ABSTRACT

A copper alloy material for lead frames for semiconductor devices. The lead frame material consists essentially of:

Ni: 0.5–2 percent by weight;
Sn: 1.2–2.5 percent by weight;
Si: 0.05–0.5 percent by weight;
Zn: 0.1–1 percent by weight;
Ca: 0.001–0.01 percent by weight;
Mg: 0.001–0.05 percent by weight;
Pb: 0.001–0.01 percent by weight; and
Cu and inevitable impurities: the balance.

The lead frame material obtained possesses not only high strength, but also excellent thermal-exfoliation resistance of the solder, and also enhances the wear resistance of the stamping dies, while possessing excellent other properties, such as repeated-bending strength, thermal conductivity and electrical conductivity, platability, and solderability, which are required of lead frames.

3 Claims, No Drawings

COPPER ALLOY LEAD FRAME MATERIAL FOR SEMICONDUCTOR DEVICES

BACKGROUND OF THE INVENTION

This invention relates to a copper alloy material for lead frames for semiconductor devices, and more particularly to a copper alloy material which is excellent in strength and thermal-exfoliation resistance of a solder applied on the leads, as well as stamping-die wear resistance, i.e., property of reducing the wear of stamping dies used for stamping outlead frames from a strip of the copper alloy material.

Conventionally, Cu alloys having a typical composition consisting essentially by weight of 2% Sn, 0.2% Ni, and 0.05% P have been widely used as materials for lead frames (hereinafter called as "lead frame material(s)") for semiconductor devices such as IC's, LSI's, and VLSI's.

However, in recent years, it has been required for lead frame materials to possess further improved strength for use as lead frames, so as to cope with the demand for improved performance or efficiency and increased wiring densities of semiconductor devices. The above-mentioned conventional copper alloy lead frame materials are fairly excellent in repeated-bending strength, thermal conductivity and electrical conductivity, platability, and solderability (soldering adhesion), but do not possess sufficient strength and are therefore unable to fully exhibit these properties. Furthermore, they are not satisfactory in respect of thermal-exfoliation resistance of a solder applied on the leads and hence have low solderability of the semiconductor devices. Still further, from the viewpoint of economy a demand has arisen for improving the wear resistance of dies used for stamping copper alloy lead frames, to reduce the manufacturing cost.

SUMMARY OF THE INVENTION

It is the object of the invention to provide a copper alloy lead frame material for semiconductor devices, which possesses not only high strength, but also excellent thermal-exfoliation resistance of the solder, and also enhances the wear resistance of the stamping dies, while possessing excellent other properties, such as repeated-bending strength, thermal conductivity and electrical conductivity platability, and solderability, which are required of lead frames.

To achieve the above object, the present invention provides a copper alloy material for lead frames for semiconductor devices, which consists essentially of:
Ni: 0.5–2 percent by weight;
Sn: 1.2–2.5 percent by weight;
Si: 0.05–0.5 percent by weight;
Zn: 0.1–1 percent by weight;
Ca: 0.001–0.01 percent by weight;
Mg: 0.001–0.05 percent by weight;
Pb: 0.001–0.01 percent by weight; and
Cu and inevitable impurities: the balance.

The above and other objects, features and advantages of the invention will be more apparent from the ensuing detailed description.

DETAILED DESCRIPTION

Under the aforestated circumstances, the present inventors have made studies in order to obtain a lead frame material which possesses high strength, excellent thermal-exfoliation resistance of the solder, and excellent stamping-die wear resistance, and have reached the finding that a copper alloy consisting essentially of:
Ni: from 0.5 to 2 percent by weight;
Sn: from 1.2 to 2.5 percent by weight;
Si: from 0.05 to 0.5 percent by weight;
Zn: from 0.1 to 1 percent by weight;
Ca: from 0.001 to 0.01 percent by weight;
Mg: from 0.001 to 0.05 percent by weight;
Pb: from 0.001 t6o 0.01 percent by weight: and
Cu and inevitable impurities: the balance,
possesses properties suitable for use as a lead frame material for semiconductor devices. Specifically, the above copper alloy possess tensile strength as high as 60 kg/mm$^2$ or more, excellent thermal-exfoliation resistance of the solder, and excellent stamping-die wear resistance, while possessing repeated-bending strength, thermal conductivity and electrical conductivity, platability, and solderability, which are almost as high as the conventional lead frame material.

The present invention is based upon the above finding.

The contents of the component elements of the copper alloy lead frame material for semiconductor devices according to the invention have been limited as previously stated, for the following reasons:

(a) Nickel (Ni)

Nickel serves to enhance the strength and repeated-bending strength of the lead frame material. However, if the nickel content is less than 0.5% by weight, the above action cannot be performed to a desired extent. On the other hand, if the nickel content exceeds 2% by weight, the lead frame material will have degraded hot workability. Therefore, the nickel content has been limited within a range from 0.5 to 2% by weight, and preferably within a range from 1.0 to 2.0 by weight.

(b) Tin (Sn)

Tinacts in cooperation with the nickel to increase the strength and repeatd-bending strength of the lead frame material. However, if the tin content is less than 1.2% by weight, the above action cannot be performed to a desired extent. On the other hand, if the tin content exceeds 2.5% by weight, it causes degradation of the hot workability of the lead frame material, similarly to the case of nickel. Therefore, the tin content has been limited within a range from 1.2 to 2.5% by weight, and preferably within a range from 1.5 to 2.5 by weight.

(c) Silicon (Si)

Silicon combines principally with Ni to form an Ni$_3$Si compoud which acts to increase the strength of the lead frame material. However, if the silicon content is less than 0.05% by weight, the above action cannot be performed to a desired extent, failing to obtain required strength. On the other hand, if the silicon content exceeds 0.5% by weight, free silicon will be formed in the material, which impairs the thermal-exfoliation resistance of the solder. Therefore, the silicon content has been limited within a range from 0.05 to 0.5% by weight.

(d) Zinc (Zn)

Zinc serves to further improve the thermal-exfoliation resistance of the solder. However, if the zinc content is less than 0.1% by weight, the thermal-exfoliation resistance cannot be improved to a required level. On the other hand, if the zinc content exceeds 1% by weight, the lead frame material has degraded solderability. Therefore, the zinc content has been limited within a range from 0.1 to 1 % by weight.

(e) Calcium (Ca), Magnesium (Mg), and Lead (Pb)

Calcium, magnesium, and lead cooperatively act to improve the stamping-die wear resistance of the lead frame material, when they are all present in the material. However, if any one of these elements is not contained in a predetermined amount, that is, if any element has a content less than 0.001% by weight, desired stamping-die wear resistance cannot be obtained. On the other hand, if the calcium content exceeds 0.01% by weight, the calcium is consumed in a great amount by oxidation upon adding thereof, thus lowering the yield, which is uneconomical. If the magnesium content exceeds 0.05% by weight, the molten copper alloy has degraded castability into an alloy cake and accordingly the resulting alloy cake has increased defects. If the lead content exceeds 0.01% by weight, part of the lead contained in the material precipitates at grain boundaries during casting, which degrades the hot rollability of the lead frame material. Therefore, the calcium content has been liited within a range from 0.001 to 0.01% by weight, the magnesium content within a range from 0.001 to 0.05% by weight, and the lead content within a range from 0.001 to 0.01% by weight.

In manufacturing the copper alloy lead frame material according to the invention, phosphrous, aluminum, titanium, or boron may conveniently be added as a deoxidizing agent during preparation of the molten copper alloy. Although the resulting lead frame material may contain a slight amount of one or more of these elements if added, the element or elements have substantially no effect upon the properties of the material if the total content of these elements is not larger than 0.02% by weight.

An example of the invention will now be explained hereinbelow, in order to show that the copper alloy lead frame material according to the present invention has excellent properties as compared with comparative and conventional copper alloy lead frame materials.

EXAMPLE

Copper alloys having chemical compositions shown in Table were melted into molten alloys in the atmosphere in an ordinary low-frequency channel type smelting furnace, in such a manner that the surface of the molten alloy is floated with pieces of charcoal for preventing oxidation of the molten alloy, followed by casting the molten alloys, according to a conventional semicontinuous casting method into copper alloy cakes each having a size of 160 mm in thickness, 450 mm in width, and 2400 mm in length. The cakes were hot rolled at a hot rolling temperature of 800° C. into hot rolled plates each having a thickness of 10 mm, and the hot rolled plates were immediately quenched. After being quenched, the hot rolled plates each had its both sides scalped, followed by repeatedly alternately subjecting them to cold rolling, annealing, and pickling, in the mentioned order, into cold rolled sheets each having a thickness of 0.5 mm. Then, the cold rolled sheets were annealed at a temperature of 500° C. for 2 hours, and were cold rolled again to a thickness of 0.25 mm. Further, the cold rolled sheets were finally annealed to relieve internal stresses in a continuous annealing furnace at a temperature of 500° C. for 20 seconds to obtain copper alloy lead strips Nos. 1-15 according to the present invention and comparative copper alloy lead strips Nos. 1-8, as shown in Table.

The comparative lad strips Nos. 1-8 each have a chemical composition in which one of the component elements has its content falling outside or lower than the range of the present invention, except for the comparative lead strip No. 4 whose Si content falls outside or higher than the range of the present invention.

Then, the lead strips Nos. 1-15 according to the present invention, the comparative lead strips 1-8, and a conventional lead strip having a chemical composition shown in Table and the same thickness as that of the former, i.e., 0.25 mm, which is commercially available, were subjected to a tensile test, a solder thermal-exfoliation test, a repeated-bending test, a stamping-die wear test, for evaluation of strength, thermal-exfoliation resistance of the solder, repeated-bending strength, and stamping-die wear resistance, respectively.

TABLE 1/2

| | CHEMICAL COMPOSITION (WT %) | | | | | | | TENSILE STRENGTH (kgf/mm²) | ELONGATION (%) | EXFOLIATION OF SOLDER AT BENT PORTION | AVERAGE NUMBER OF CYCLES REPEATED BEFORE FRACTURE | NUMBER OF TIMES OF STAMPING (× 10⁴ times) |
|---|---|---|---|---|---|---|---|---|---|---|---|---|
| | Ni | Sn | Si | Zn | Ca | Mg | Pb | Cu + IMPURITIES | | | | | |
| LEAD STRIPS ACCORDING TO THE PRESENT INVENTION | | | | | | | | | | | | | |
| 1 | 0.52 | 1.81 | 0.271 | 0.54 | 0.0051 | 0.0254 | 0.0061 | THE BAL. | 60.9 | 7 | NIL | 5.7 | 172 |
| 2 | 1.24 | 1.77 | 0.276 | 0.53 | 0.0047 | 0.0251 | 0.0045 | " | 64.8 | 8 | " | 6.8 | 169 |
| 3 | 1.98 | 1.82 | 0.274 | 0.56 | 0.0048 | 0.0250 | 0.0050 | " | 67.5 | 8 | " | 7.4 | 148 |
| 4 | 1.26 | 1.21 | 0.272 | 0.54 | 0.0047 | 0.0221 | 0.0038 | " | 64.1 | 7 | " | 6.6 | 165 |
| 5 | 1.25 | 2.48 | 0.275 | 0.52 | 0.0048 | 0.0246 | 0.0042 | " | 67.4 | 9 | " | 7.5 | 170 |
| 6 | 1.24 | 1.80 | 0.052 | 0.55 | 0.0052 | 0.0245 | 0.0058 | " | 60.7 | 7 | " | 5.6 | 171 |
| 7 | 1.23 | 1.79 | 0.491 | 0.53 | 0.0053 | 0.0253 | 0.0044 | " | 67.6 | 8 | " | 7.3 | 165 |
| 8 | 1.25 | 1.75 | 0.270 | 0.11 | 0.0051 | 0.0239 | 0.0055 | " | 64.7 | 8 | " | 6.5 | 166 |
| 9 | 1.23 | 1.83 | 0.273 | 0.98 | 0.0049 | 0.0263 | 0.0051 | " | 64.9 | 8 | " | 6.8 | 170 |
| 10 | 1.21 | 1.81 | 0.279 | 0.56 | 0.0012 | 0.0249 | 0.0046 | " | 64.6 | 8 | " | 6.9 | 152 |
| 11 | 1.24 | 1.84 | 0.278 | 0.61 | 0.0095 | 0.0250 | 0.0059 | " | 65.0 | 8 | " | 6.6 | 171 |
| 12 | 1.26 | 1.78 | 0.274 | 0.48 | 0.0038 | 0.0011 | 0.0057 | " | 64.3 | 8 | " | 7.0 | 142 |
| 13 | 1.25 | 1.79 | 0.273 | 0.52 | 0.0051 | 0.0492 | 0.0049 | THE BAL. | 65.7 | 8 | NIL | 6.2 | 183 |
| 14 | 1.24 | 1.85 | 0.269 | 0.48 | 0.0043 | 0.0230 | 0.0013 | " | 64.5 | 8 | " | 6.7 | 158 |
| 15 | 1.24 | 1.83 | 0.281 | 0.45 | 0.0045 | 0.0244 | 0.0095 | " | 64.6 | 8 | " | 6.7 | 177 |
| COMPARATIVE LEAD STRIPS | | | | | | | | | | | | | |
| 1 | 0.32* | 1.80 | 0.277 | 0.56 | 0.0053 | 0.0258 | 0.0046 | " | 58.1 | 6 | " | 5.2 | 171 |
| 2 | 1.27 | 0.96* | 0.274 | 0.55 | 0.048 | 0.0248 | 0.0053 | " | 60.3 | 7 | " | 5.4 | 162 |
| 3 | 1.24 | 1.88 | 0.031* | 0.47 | 0.0047 | 0.0247 | 0.0049 | " | 57.6 | 7 | " | 5.1 | 171 |
| 4 | 1.26 | 1.75 | 0.595* | 0.49 | 0.0039 | 0.0256 | 0.0048 | " | 67.9 | 8 | PRESENT | 7.4 | 164 |
| 5 | 1.25 | 1.76 | 0.273 | 0.05* | 0.0056 | 0.0255 | 0.0050 | " | 64.7 | 8 | " | 6.8 | 168 |
| 6 | 1.25 | 1.74 | 0.284 | 0.54 | —* | 0.0251 | 0.0051 | " | 64.8 | 8 | NIL | 6.7 | 137 |
| 7 | 1.23 | 1.81 | 0.279 | 0.55 | 0.0039 | —* | 0.0053 | " | 64.5 | 8 | " | 6.9 | 130 |
| 8 | 1.24 | 1.83 | 0.281 | 0.54 | 0.0049 | 0.0250 | —* | " | 64.9 | 8 | PRESENT | 6.6 | 140 |
| CONVENTIONAL LEAD STRIP | 0.21 | 2.02 | P: 0.053 | — | — | — | — | | 55.6 | 8 | PRESENT | 5.5 | 123 |

(*THE COMPONENT MARKED WITH AN ASTERISK FALLS OUT OF THE RANGE OF THE PRESENT INVENTION)

In the tensile test, test pieces were used which were cut out of a rolled sheet in the direction of rolling in accordance with JIS (Japanese Industrial Standard) Test Piece No. 5 and tested with respect to the tensile strength and elongation thereof.

In the solder thermal-exfoliation test, test pieces each having a size of 0.25 mm in thickness, 15 mm in width, and 60 mm in length were treated with a rosin flux, and then dipped in a solder-bath having a chemical composition of Sn: 60% and Pb: 40% to have their outer surfaces plated with the solder, followed by being heat treated in the atmosphere at a temperature of 150° C. for 1000 hours. Then, the heat treated test pieces were each bent through 180 degrees so as to lie flat on itself, and then bent back to their initial positions and the occurrence of exfoliation of the solder from the test pieces at the bent portions were checked.

Further, in the repeated-bending test, test pieces each having a size of 0.25 mm in thickness and 0.5 mm in width were horizontally placed with its one end fixed to a tester. The test pieces were each bent by 90 degrees by applying a load having a weight of 226.8 g (8 ounces) at another end thereof and bent back to their initial positions. This cycle was repeated until the test piece was ultimately fractured. Ten test pieces were used for testing each of the lead strips. The number of cycles repeated until each of the ten test pieces was fractured was counted and an average value of counted cycle numbers for the ten test pieces was calculated.

Further, in the stamping-die wear test, a set of dies formed of a WC-base sintered hard alloy having a chemical composition of Co: 16% and WS: the balance, which is commercially available, was used. Lead frames each having 16 leads were stamped one by one by the use of a press, until burrs of the maximum heigh 0.015 mm occurred on the stamped lead frame. The number of times of stamping executed until the burr occurred was counted.

All the results of the tests conducted as above are shown in Table.

From the test results shown in Table, it is noted that all of the copper alloy lead strips Nos. 1-15 according to the present invention are much superior in strength, thermal-exfoliation resistance of the conventional copper alloy lead strip, and as excellent in repeated-bending strength as the conventional copper alloy lead strip. On the other hand, as seen in the comparative copper alloy lead strips Nos. 1-8, if any one of the component elements has a content falling outside or lower than the range of the present invention, or if the Si content falls outside or higher than the range of the present invention, the resulting lead frame material is clearly degraded in at least one of strength, thermal-exfoliation resistance of the solder, and stamping-die wear resistance.

Further, the copper alloy lead strips Nos. 1-15 according to the present invention were also tested with respect to thermal conductivity and electrical conductivity, platability, and solderability, and the test results showed that they exibit electrical conductivity of 20% and more, which is by far higher than 3% (ICAS %) which is the minimum required value for lead frame materials (e.g., an Fe-42% Ni alloy) for semiconductor devices, and accordingly also exhibit excellent thermal conductivity, and they possess platability and solderability almost as high as those of the conventional lead frame material.

As stated above, the copper alloy lead frame material according to the present invention possesses not only improved strength, excellent thermal-exfoliation resistance of the solder, and excellent stamping-die wear resistance, but also possesses excellent properties such as repeated-bending strength, platability, and solderability, which are all required of lead frames, thereby contributing to improvement of the performance or efficiency of semiconductor devices and increase of the wiring densities thereof, prolonging the service life of stamping dies used for manufacturing the lead frame material, and enabling the semiconductor device to exhibit excellent performance and reliability over a long time.

What is claimed is:

1. A copper alloy material for lead frames for semiconductor devices, which consists essentially of:
   Ni: 0.5 -2 percent by weight;
   Sn: 1.2 -2.5 percent by weight;
   Si: 0.05 -0.5 percent by weight;
   Zn: 0.1 -1 percent by weight;
   Ca: 0.001 -0.01 percent by weight;
   Mg: 0.001 -0.05 percent by weight;
   Pb: 0.001 -0.01 percent by weight; and
   Cu and inevitable impurities: the balance.

2. A copper alloy lead frame material as claimed in claim 1, wherein Ni is contained within a range from 1.0 to 2.0 percent by weight.

3. A copper alloy lead frame material as claimed in claim 1, wherein Sn is contained within a range from 1.5 to 2.5 percent by weight.

* * * * *

UNITED STATES PATENT AND TRADEMARK OFFICE
CERTIFICATE OF CORRECTION

PATENT NO. : 4,877,577
DATED : October 31, 1989
INVENTOR(S) : FUTATSUKA ET AL

It is certified that error appears in the above-identified patent and that said Letters Patent is hereby corrected as shown below:

Column 1, line 12, change "outlead" to read -- out lead --.

Column 2, line 9, change "t60" to read -- to --.

Column 2, line 38, change "Tinacts" to read -- Tin acts --.

Column 2, line 39, change "repeatd" to read -- repeated --.

Column 2, line 50, change "compoud" to read -- compound --.

Column 3, line 23, change "liited" to read -- limited --.

Column 4, line 29, change "lad" to read -- lead --.

Columns 5 and 6, Table 1/2, "Comparative Lead Strips", line 2, under column "Ca": Change "0.048" to -- 0.0048 --.

Column 7, line 35, change "heigh" to read -- height --.

Column 7, line 44, following "resistance of the", insert -- solder, and stamping-die wear resistance to the --.

Column 8, line 10, change "exibit" to read -- exhibit --.

Signed and Sealed this

Thirtieth Day of June, 1992

*Attest:*

DOUGLAS B. COMER

*Attesting Officer*     *Acting Commissioner of Patents and Trademarks*